United States Patent [19]

Fuentes

[11] Patent Number: 5,156,784
[45] Date of Patent: Oct. 20, 1992

[54] METHOD FOR FABRICATING A SILICON CARBIDE FILM TO PROVIDE IMPROVED RADIATION HARDNESS

[75] Inventor: Ricardo I. Fuentes, Hopewell Junction, N.Y.

[73] Assignee: International Business Machines Corporation, Armonk, N.Y.

[21] Appl. No.: 775,310

[22] Filed: Oct. 9, 1991

[51] Int. Cl.$^5$ .............................................. C04B 41/00
[52] U.S. Cl. .................................. 264/101; 264/235; 264/346
[58] Field of Search ........................ 264/346, 101, 235

[56] References Cited

U.S. PATENT DOCUMENTS

| | | | |
|---|---|---|---|
| 4,543,266 | 9/1985 | Matsuo et al. | 427/38 |
| 4,743,411 | 5/1988 | Shimada | 264/65 |
| 4,994,141 | 2/1991 | Harms | 156/643 |

FOREIGN PATENT DOCUMENTS 372645A  6/1990  European Pat. Off. .

*Primary Examiner*—James Derrington

[57] ABSTRACT

A method for radiation hardening by means of a suitable thermal treatment of the membrane material, which in the preferred embodiment is silicon carbide (SiC). The method includes steps of thermally treating a freestanding SiC film (drumlike membrane with a silicon frame) or an unetched film (attached to the silicon wafer throughout its entire area), in an inert atmosphere or vacuum. The temperature for the treatment may range from a couple hundred degrees Celsius to one above the growth temperature. The treatment time, depending on the anneal temperature, can be as short as few minutes or as long as a couple of hours. Optimal anneal times and temperatures will depend on the material and the degree of radiation hardening required. Significant hardening may be achieved even at the lowest temperature.

4 Claims, No Drawings

METHOD FOR FABRICATING A SILICON CARBIDE FILM TO PROVIDE IMPROVED RADIATION HARDNESS

BACKGROUND OF THE INVENTION

1. Field of the Invention

The present invention relates to a process for fabricating a membrane structure and more particularly to a process for fabricating a silicon carbide membrane for an X-ray mask having improved radiation hardness.

2. Description of the Prior Art

U.S. Pat. No. 4,543,266, issued Sep. 24, 1985 to Matsuo et al entitled METHOD OF FABRICATING A MEMBRANE STRUCTURE, discloses a process wherein a thin film which becomes a membrane is formed over one major surface of a substrate by a plasma deposition process utilizing microwave electron cyclotron resonance. The substrate is then removed, other than a portion of the substrate which remains as a frame, so as to form a membrane structure. A dense and high quality membrane is formed at a low temperature and the internal stress of the membrane is controlled by varying the conditions under which the plasma deposition process is carried out and by heat treating the thin film after its formation. The heat treatment is related only to stress control on the films. There is no teaching of improvement of radiation hardness and the thermal treatment described is not associated with minimizing radiation damage.

European Patent EP 372645A, issued Jun. 13, 1990 entitled X-RAY MASK MEMBRANE OF SILICON-CARBIDE, discloses a structure wherein, at least one of the two main surfaces of a single crystalline Si wafer, a SiC layer is formed. This is made into a mask-supporting membrane by removal of Si-material over the entire surface except the edge-regions. The feature is that before or after this selective etch, an anneal takes place at a temperature in the range of 200–1350 degrees C. for 2–10 hours in an oxidizing ambient. The preferred conditions are four hours at 1100° C. This anneal may also be given to selected areas of the SiC film using laser-beam heating in an oxidizing ambient. The SiC film may be formed by CVD on the wafer substrate. The process can produce layers with a lower stress, a higher transparency to visible light used for alignment and a lower surface roughness.

The annealing is used exclusively for stress control and the application of an antireflective oxide coating. The heat treatment is done under oxidizing atmospheres to apply the oxide coating. There is no mention of radiation damage avoidance.

SUMMARY OF THE INVENTION

An object of the present invention is to provide a method that consists of thermally treating a freestanding SiC film (such as a drumlike membrane structure with a silicon frame) or an unetched film (attached to the silicon wafer throughout its entire area) in an inert atmosphere or vacuum. The temperature for the treatment may range from a couple hundred degrees Celsius to one above the growth temperature. The treatment time, depending on the anneal temperature, can be as short as a few minutes or as long as a couple of hours. Optimal anneal times and temperatures will depend on the material and the degree of radiation hardening required. Significant hardening may be achieved even at the lower temperatures. The process succeeds in thermally exciting mechanisms that lead to the improvement of the radiation hardness of the material, and in the case of high temperature, chemically vapor deposited optical transparency of the membrane increases during the treatment.

DESCRIPTION OF A PREFERRED EMBODIMENT

X-ray mask materials are required to withstand very large doses of X-rays while suffering virtually no radiation induced distortion. Unfortunately, many materials in the as-grown state are susceptible to radiation damage.

In principle, mask material could be radiation hardened during fabrication by direct exposure to an appropriate dose of X-rays. Such method would be very expensive and rather impractical. This invention describes an improved method for radiation hardening by means of a suitable thermal treatment of the membrane material, which in the preferred embodiment is silicon carbide (SiC).

The method includes steps of thermally treating a freestanding SiC film (drumlike membrane with a silicon frame) or an unetched film (attached to the silicon wafer throughout its entire area), in an inert atmosphere or vacuum. The temperature for the treatment may range from a couple hundred degrees Celsius to one degree above the growth temperature. The treatment time, depending on the anneal temperature, can be as short as a few minutes or as long as a couple of hours. Optimal anneal times and temperatures will depend on the material and the degree of radiation hardening required. Significant hardening may be achieved even at the lowest temperature.

The process succeeds in thermally exciting mechanisms that lead to the improvement of radiation hardness of the material. For SiC film material, no known way of increasing the radiation hardness existed previously.

An additional benefit of the process in the case of high temperature chemically vapor deposited SiC, is that the optical transparency of the membrane increases during treatment.

According to the present invention, SiC membranes grown by high temperature chemically vapor deposition are heat treated to provide radiation hardness using the following sequence of steps and under the indicated conditions when the sample is placed in a treatment chamber.

Step 1. A vacuum of $10^{-6}$ Torr is slowing created around the sample in a chamber.

Step 2. The sample is ramped to a temperature of approximately 1250° C.

Step 3. The temperature is held for approximately 2 hours.

Step 4. The sample is slowly cooled, brought to atmospheric pressure and removed from the chamber.

The thickness of the SiC membranes employed in the present invention is not critical. The membrane need only be thick enough to undergo the thermal treatment. A typical range of thickness, for example, is 0.5 to 2.5 microns.

The method is performed in either vacuum ($10 \times 10^{-6}$ Torr) or inert gas. The chamber or container used in Step 1 to contain the membrane merely has to be capable of withstanding the treatment conditions of atmospheric pressure and heat load. A simple water cooled quartz bell jar may be used. The heating may be carried out using resistive state-of-the-art boron-nitride/graphic heaters. The system is a custom made tool.

The ramp time in Step 2 is unimportant from the radiation point of view of the method. It only becomes relevant since a ramp too fast can destroy the membrane. Even more important than the ramp-up (heating), is the cooling ramp. The thermal stresses and the sign of the mismatch between Si and SiC is such that during cooldown can stretch the membrane beyond its ultimate strength and break it. Typical ramp times for method Step 2 are 10 minutes up and 10 minutes down. These times do not represent the limits of the ramping speed and much faster ramps are possible.

Radiation hardening is produced in samples treated following the process steps outlined above. Samples treated according to the described method showed no radiation induced distortion at exposure levels where untreated samples would have been already distorted. One skilled in the art will appreciate that the basic process can be tailored to a specific set of material, growth-/deposition process, and desired level of hardening.

The annealing steps can also be performed on other types of SiC material, such as ECR-plasma or PECVD grown SiC.

Having thus described my invention what I claim as new and desire to secure as Letters Patent, is:

1. A process for treating a membrane structure for radiation hardness comprising the steps of:
   Step 1. placing a membrane composed of silicon carbide at a pressure and temperature environment in a closed chamber,
   Step 2. increasing the temperature in said chamber to a value between 1100 to 1300 degrees centigrade,
   Step 3. maintaining the temperature in said chamber at the value of Step 2 for a time period in the order of two hours, wherein the pressure in said chamber in Steps 1, 2 and 3 is a vacuum pressure approximately $10 \times 10^{-6}$ Torr,
   Step 4. bringing said membrane to atmospheric pressure and room temperature.

2. A process according to claim 1 wherein the temperature in said vacuum chamber in Steps 2 and 3 is approximately 1250 degrees centigrade.

3. A process according to claim 1 wherein said temperature is increased in Step 2 over a ramp time of ten minutes.

4. A process according to claim 3 wherein said temperature is decreased in Step 4 over a ramp time of ten minutes.

* * * * *